(12) United States Patent
Ren et al.

(10) Patent No.: US 10,256,144 B2
(45) Date of Patent: Apr. 9, 2019

(54) PROCESS INTEGRATION APPROACH OF SELECTIVE TUNGSTEN VIA FILL

(71) Applicant: Applied Materials, Inc., Santa Clara, CA (US)

(72) Inventors: He Ren, San Jose, CA (US); Feiyue Ma, San Jose, CA (US); Yu Lei, Belmont, CA (US); Kai Wu, Palo Alto, CA (US); Mehul B. Naik, San Jose, CA (US); Zhiyuan Wu, San Jose, CA (US); Vikash Banthia, Los Altos, CA (US); Hua Al, Tracy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/498,024

(22) Filed: Apr. 26, 2017

(65) Prior Publication Data

US 2018/0315650 A1   Nov. 1, 2018

(51) Int. Cl.
| H01L 21/4763 | (2006.01) |
| H01L 21/768 | (2006.01) |
| H01L 21/285 | (2006.01) |
| H01L 23/532 | (2006.01) |
| H01L 23/522 | (2006.01) |

(52) U.S. Cl.
CPC .. *H01L 21/76879* (2013.01); *H01L 21/28562* (2013.01); *H01L 21/76816* (2013.01); *H01L 21/76831* (2013.01); *H01L 21/76834* (2013.01); *H01L 23/5226* (2013.01); *H01L 23/53209* (2013.01); *H01L 23/53214* (2013.01); *H01L 23/53228* (2013.01); *H01L 23/53257* (2013.01)

(58) Field of Classification Search
None
See application file for complete search history.

(56) References Cited

U.S. PATENT DOCUMENTS

| 2002/0170891 A1* | 11/2002 | Boyle ............... B23K 26/12 |
| | | 219/121.67 |
| 2003/0186539 A1 | 10/2003 | Lee et al. |
| 2006/0003486 A1* | 1/2006 | Lai ............... H01L 21/321 |
| | | 438/76 |
| 2015/0170961 A1 | 6/2015 | Romero et al. |
| 2015/0217330 A1 | 8/2015 | Haukka et al. |
| 2017/0053864 A1 | 2/2017 | Peng et al. |
| 2017/0069527 A1 | 3/2017 | Haukka et al. |
| 2017/0110368 A1 | 4/2017 | Yu et al. |

OTHER PUBLICATIONS

PCT International Search Report dated Jan. 7, 2019 for Application No. PCT/US2018/028036.

* cited by examiner

*Primary Examiner* — Long Pham
(74) *Attorney, Agent, or Firm* — Patterson + Sheridan, LLP

(57) ABSTRACT

Embodiments of the present disclosure generally relate an interconnect formed on a substrate and a method of forming the interconnect thereon. In an embodiment, a via and trench in a stack formed on the substrate. A bottom of the via is pre-treated using a first pre-treatment procedure. A sidewall of the via is pre-treated using a second pre-treatment procedure. A first metal fill material of a first type is deposited on the stack, in the via. A second metal fill material of a second type is deposited on the stack, in the trench.

20 Claims, 4 Drawing Sheets

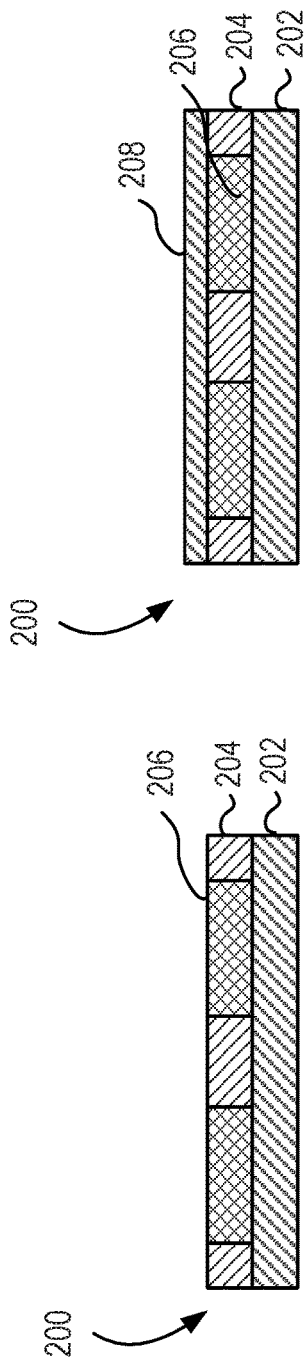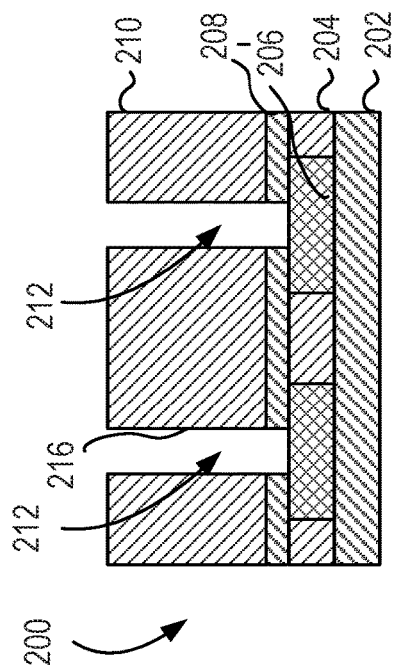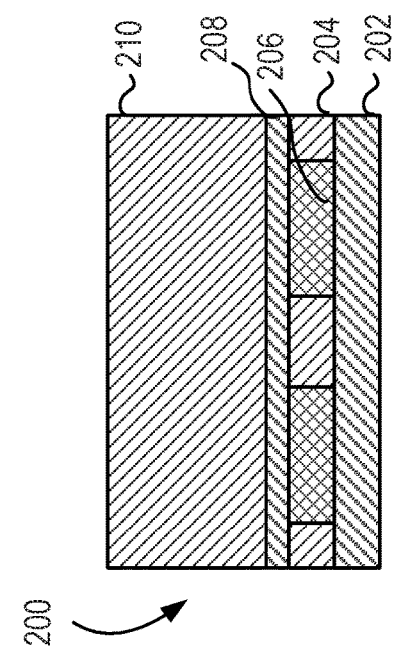

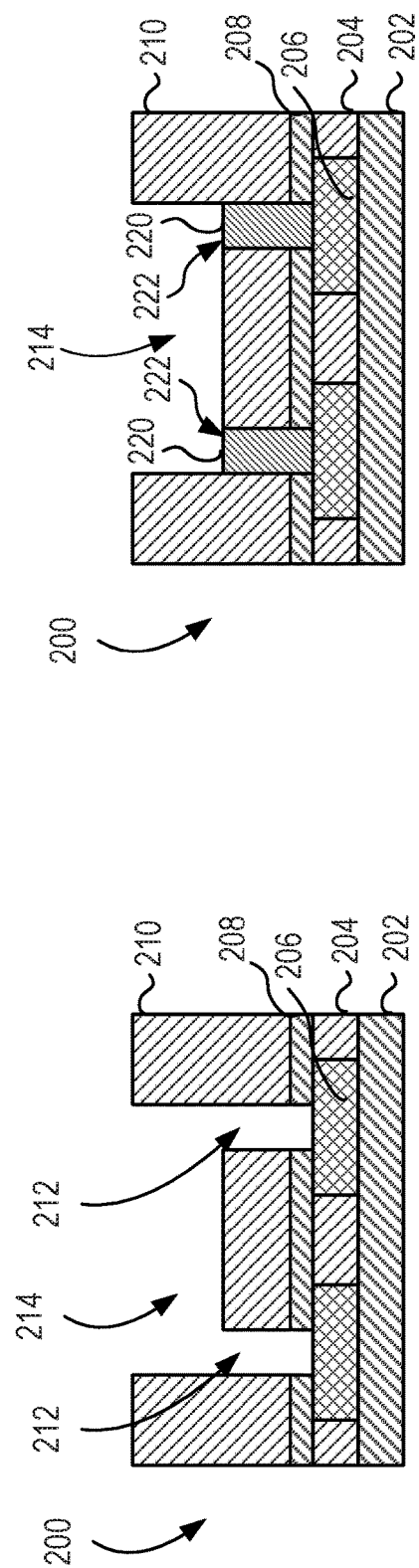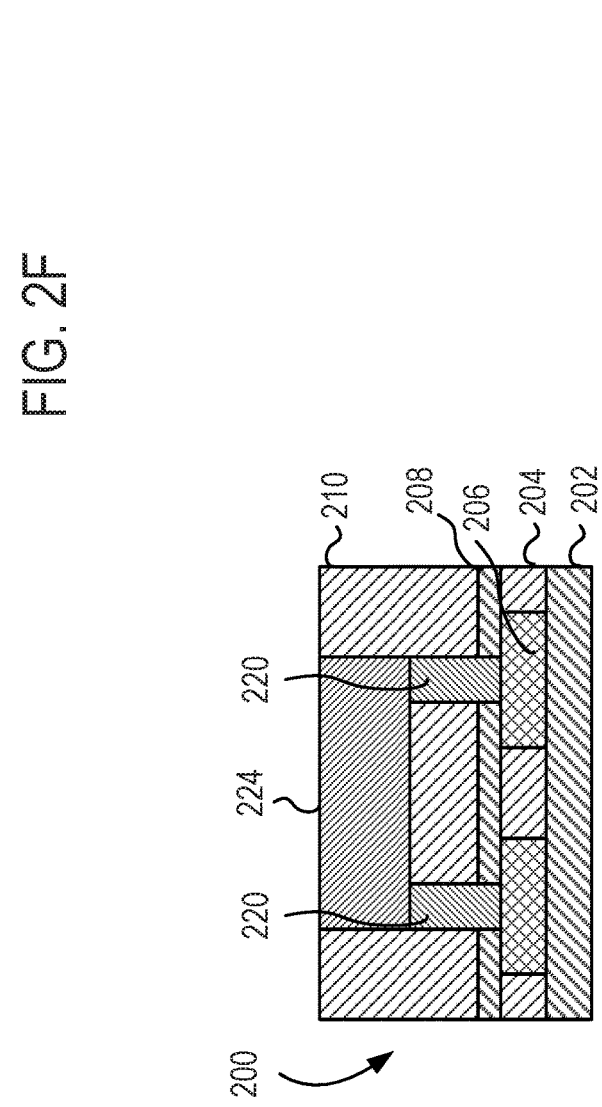

PROCESS INTEGRATION APPROACH OF SELECTIVE TUNGSTEN VIA FILL

BACKGROUND

Field

Embodiments of the present disclosure generally relate to an improved method of forming interconnects.

Description of the Related Art

Reliably producing sub-100 nm and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success, and to the continued effort to increase circuit density and quality of individual substrate and die.

As circuit densities increase for next generation devices, the widths of interconnects, such as vias, trenches, contacts, gate structures, and other features, as well as the dielectric materials therebetween, decrease to 45 nm and 32 nm dimensions or below, where as the thickness of the dielectric layer remain substantially constant, with the result of increasing the aspect ratios of the features. In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. 3D stacking of semiconductor chips reduces wire lengths and keeps wiring delay low. In manufacturing, 3D stacking of semiconductor chips, stair-like structures are often utilized to allow multiple interconnection structures to be disposed thereon, forming high-density of vertical transistor devices.

Thus, there is a continual need for improved methods of forming interconnects to decrease the manufacturing costs, memory cell size, and power consumption of the integrated circuits.

SUMMARY

Embodiments of the present disclosure generally relate an interconnect formed on a substrate and a method of forming the interconnect thereon. In an embodiment, a via and trench in a stack formed on the substrate. A bottom of the via is pre-treated using a first pre-treatment procedure. A sidewall of the via is pre-treated using a second pre-treatment procedure. A first metal fill material of a first type is deposited on the stack, in the via. A second metal fill material of a second type is deposited on the stack, in the trench.

In another embodiment, a method of forming an interconnect is disclosed herein. A dielectric barrier layer is deposited over a first dielectric layer and a conductive layer formed on a substrate. A second dielectric layer is deposited over the dielectric barrier layer. A via is formed through the second dielectric layer and the dielectric barrier layer. A trench is formed in the second dielectric layer. A bottom of the via is pre-treated using a first pre-treatment procedure. A sidewall of the via is pre-treated using a second pre-treatment procedure. A first metal layer formed from a first material of the first type is deposited in the via. A second metal layer formed from a second material of the second type is deposited in the trench.

In another embodiment, an interconnect is disclosed herein. The interconnect includes a stack formed on a substrate. The stack has a via and a trench formed therein. A first metal layer of a formed from a first material of a first type is deposited in the via. A second metal layer formed from a second material of a second type is deposited in the trench.

DETAILED DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-2G illustrate side cross-sectional views of an interconnect formed on a substrate at different stages of the method of FIG. 1, according to one embodiment.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Figure 1:
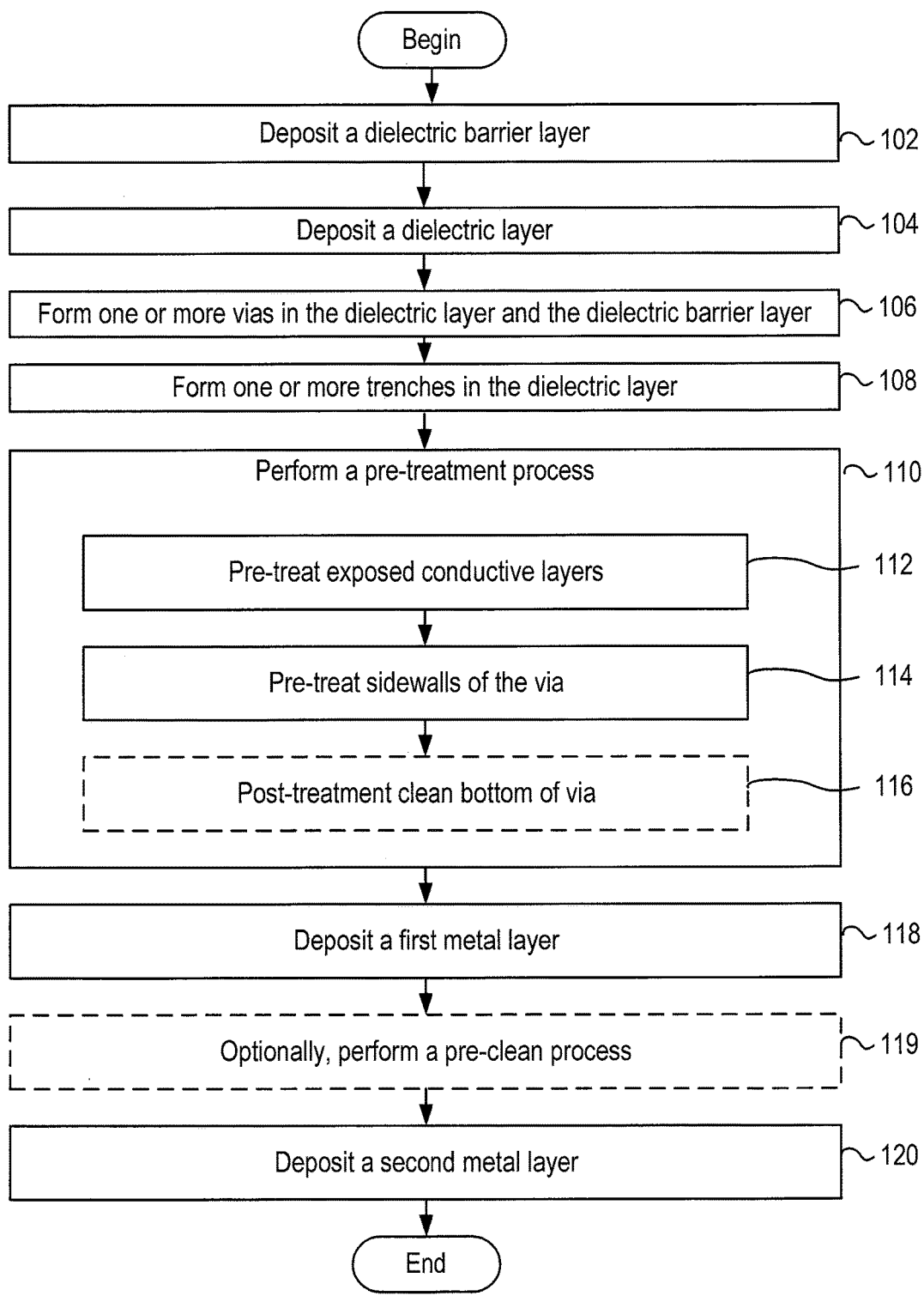
FIG. 1 illustrates a method of forming an interconnect, according to one embodiment.

FIG. 1 is a flow diagram that illustrates one embodiment of a method 100 for forming an interconnect on a substrate. FIGS. 2A-2E illustrate cross-sectional views of the substrate prior to, and at different stages of, the method 100 of FIG. 1.

FIG. 2A illustrates a cross-sectional view of an interconnect 200 prior to commencement of method 100. Generally, the interconnect 200 includes multiple film layers that may be utilized to form an interconnect structure, such as a dual damascene structures. A film stack 201 is formed on a substrate 202. The stack 201 includes a dielectric layer 204. The dielectric layer 204, as shown in FIG. 2A, is disposed on the substrate 202 and has a conductive layer 206 formed in, and bounded by, the dielectric layer 204. In one example, the dielectric layer 204 may be formed from one or more insulating materials such as silicon oxide. In one example, the conductive layer 206 may be formed from a conductive layer, such as copper.

At block 102, a dielectric barrier layer 208 is deposited on the substrate 202, as illustrated in FIG. 2B. For example, as illustrated, the dielectric barrier layer 208 is deposited over both the dielectric layer 204 and the conductive layer 206. Accordingly, the dielectric barrier layer 208 may formed a uniform, uninterrupted, layer over the dielectric layer 204 and the conductive layer 206. The dielectric barrier layer may be formed from a low-k material. For example, the dielectric barrier layer 208 may be formed from a carbon containing silicon layer (SiC), a nitrogen doped carbon containing silicon layer (SiCN), a silicon nitride layer, a metal nitride or metal oxide (e.g., AlN, AlOx, AlON), or the like.

At block 104, an dielectric layer 210 is deposited on the substrate 202, as illustrated in FIG. 2C. For example, as illustrated, the dielectric layer 210 is deposited over the dielectric barrier layer 208. The dielectric layer 210 may be substantially similar to dielectric layer 204. In one embodiment, dielectric layer 210 may be formed from the same material as dielectric layer 204. In another embodiment, dielectric layer 210 may be formed from a different material than dielectric layer 204, while maintaining the same low-k properties.

At block 106, one or more vias 212 are formed in the interconnect 200 to expose the conductive layer 206, as illustrated in FIG. 2D. For example, the vias 212 may be formed through both the dielectric layer 210 and the dielectric barrier layer 208 to expose the underlying conductive layer 206. Generally, the vias 212 have a width, W1. In some embodiments, the width of each via 212 is uniform an entire length of the via 212. In other embodiments, the width of each via 212 may change gradually from a top of the via 212 to a bottom of the via 212.

At block 108, one or more trenches 214 are formed in the interconnect 200, as illustrated in FIG. 2E. The one or more trenches 214 may be formed in the dielectric layer 210. The trenches 214 are configured to widen at least a portion of the via 212. In some embodiments, block 108 may be performed prior to block 106, i.e., the trenches 214 may be formed before the vias 212. In other embodiments, such as the one being described, the trenches 214 are formed subsequent to the forming of the vias 212.

In traditional fabrication schemes, a "fill process" is performed to fill the via 212 and trench 214 are filled with a metal material to form the interconnect 200. For example, a metal, such as copper, may be used to fill both the via 212 and the trench 214. It has been found that filling both the via 212 and the trench 214 with the same material leads to a high interconnect resistance, which may lead to an RC delay and IR drop in semiconductor chips.

Interconnect resistance on chip influences the chip speed as a result of RC delay and power management by IR drop. As design rules continually shrink, interconnect resistance reduction becomes an increasingly important priority. In particular, via (e.g., via 212) resistance weighs significantly on the overall resistance with short interconnect lines, smaller via dimension below 40 nm, and multiple layer routings with via stack, i.e. there is a higher resistance through the via than there is through the lines. Therefore, reducing via resistance has become increasingly important to achieve chip performance.

Conventional via formation leads to a high resistance due to the materials used in process integration. After block 108, in conventional methods, via fill is completed with metal barrier, liner, and bulk filling metal. Metal barrier and liner are used for reliability and gap-fill robustness. However, the materials used for the barrier and liner layer, as a result of their high resistivities, may lead to a high via resistance when deposited at via bottom. As an example, the conventional dual-damascene copper fill may consist of a TaN barrier layer (deposited through a physical vapor deposition (PVD process), a Ta metal liner layer deposited on the barrier layer (e.g., PVD or chemical vapor deposition (CVD) process), and a Cu seed/plating layer deposited on the metal liner layer. The barrier and liner weigh is more than about 50-90% of total via resistance, depending on the via dimension. Thus, removal of the metal barrier and the liner layers may aid in reducing via resistance. At the same time, however, potential risks may occur as a result of eliminating the barrier and liner layer. For example, the interconnect will still need to meet reliability aspects, including avoidance of dielectric breakdown and metal electromigration. Additionally, a suitable metal fill process integration in the dual damascene structure may be needed to improve both via resistance and line resistance.

As such, the following discussion proposes a selective fill approach (e.g., a W fill approach), which demonstrates a lower via resistance and simultaneously meets integration and reliability requirements. An interface treatment (discussed below in conjunction with at least block 110) and fill process (discussed below in conjunction with at least block 118) are developed to selectively grow a metal material (e.g., W) from a via bottom without damaging an underlying metal layer (e.g., Cu, W, Co, and the like) and surrounding dielectrics (e.g., low-k dielectrics, oxides, and the like). As a result, the below discussion provides one or more techniques to lower via resistance. following the via fill, a damascene fill will follow, which aids in forming an equivalent line resistance.

The improved method 100 includes using a selective metal via fill to reduce resistance and meet reliability (interaction with sidewall dielectrics 204 and exposed conductive layer 206) and line resistance requirements. At block 110, one or more pre-treatment processes are performed on the interconnect 200 to prepare the interconnect 200 to receive a selective metal via 212 fill. For example, block 110 may include sub-blocks 112-116.

At sub-block 112, the interconnect 200 undergoes a first treatment process for the exposed portion of the conductive layer 206 in the via 212. For example, the first pretreatment process is used to prepare the exposed portion of the conductive layer 206 for a bottom-up growth when the via 212 is deposited with a first metal. A remote plasma clean process may be used to pre-treat the interconnect. The interconnect 200 may be transferred to a pre-treatment chamber where the interconnect 200 undergoes a cleaning process. For example, the interconnect may undergo a cleaning process between about 250-350° C., using an $H_2$/Ar mixture, at a temperature of about 1-10 Torr. In other embodiments, a slight bias energy may be applied to facilitate oxide knock-off without metal sputtering. For example, an energy of 0-200 W may be applied to the pre-treatment chamber.

At sub-block 114, the interconnect 200 undergoes a second pre-treatment process. The second treatment process is used to passivate sidewalls 216 of the via to minimize undesirable sidewall growth. As mentioned above, the dielectric layer 204 may be formed from a low-k material. As such, the second pre-treatment process aids in sealing surface pores of the dielectric layer 204, and protect the dielectric layer 204 from soaking precursors. In one embodiment, the second pre-treatment process may be a thermal precursor soak at elevated temperatures (e.g., 200-400° C.). In some examples, the precursors that may be used are Tetramethylsilane (TMS), dimethylaminotrimethylsilane (DMATMS), and the like. In one embodiment, the second pre-treatment process in sub-block 114 may further include adding ultra-violet (UV) energy to the precursor soaking process, by subjecting the interconnect 200 to a UV baking process.

In some embodiments, block 110 may include sub-block 116. At block 116, the interconnect 200 undergoes an optional post-treatment clean. For example, the optional pre-treatment clean may be used in case of oxidation or residue growth at a bottom of the via 212. The optional pre-treatment clean uses a peroxide ($H_2O_2$) containing chemistry with alkaline pH tuning to slightly strip away the residue.

At block 118, following the pre-treatment process (block 110), a metal 220 selectively fills the via 212, as illustrated in FIG. 2F. For example, a metal 220 material is deposited in the via 212 up to a point 222 where the via 212 meets the trench 214. The metal 220 used may be any suitable metal material such as ruthenium (Ru), tungsten (W), cobalt (Co), aluminum (Al) or the like. The main requirement for metal 220 is that it is a different material as the subsequent metal deposited in the trench 214. Selectively depositing the metal 220 in the via aids in reducing the via resistance, and meeting reliability and line resistance requirements.

The metal 220 may be deposited using a chemical vapor deposition (CVD) process. The CVD process may include an $H_2$ pre-soak at elevated temperatures (e.g., 350-500° C.). The CVD process may be performed at temperatures of about 200-500° C., using a low flow rate (e.g., 2-100 sccm) of a metal-containing precursor (e.g., $WF_6$) in a vast $H_2$ ambient environment. The combination of flow rate, pressure, and temperature aids in reducing morphology of the metal 220 when deposited. Prior to the metal 220 material being deposited, a conventional nucleation layer may be applied for the initial 1-3 nm of nucleation. The overall growth amount is controlled by process time, pressure, and precursor flow to uniformly fill the via 212.

At block 120, a second metal 224 is deposited in each trench 214. For example, the second metal 224 is deposited from the point 222 to a top of the trench 214. The second metal 224 used may be any suitable metal material such as ruthenium (Ru), tungsten (W), cobalt (Co), aluminum (Al), copper (CU), and the like. The main requirement for second metal 224 is that it is a different material as the first metal 220 material deposited in the via 212. The second metal 224 may be deposited using a CVD process. Bifurcating the conventional metal fill of a singular metal material into a two step process involving a first metal 220 deposited in the via 212, and a second metal 224 deposited in the trench 214 aids in decreasing the resistance through the via 212.

In some embodiments, a barrier seed layer 226 may be deposited over the first metal 220 prior to deposition of the second metal 224. For example, provided that the second metal 224 is copper, the barrier seed layer 226 may be a copper barrier seed layer 226.

In some embodiments, method 100 may include an optional block 119, performed prior to deposition of the second metal 224. At block 119, the interconnect 200 may undergo a pre-treatment process prior to the second metal 224. The pre-treatment process may be used to remove any oxide that may have been formed on a top surface of the first metal 220. For example, the interconnect 200 may undergo a process similar to sub-block 112.

Figure 3:
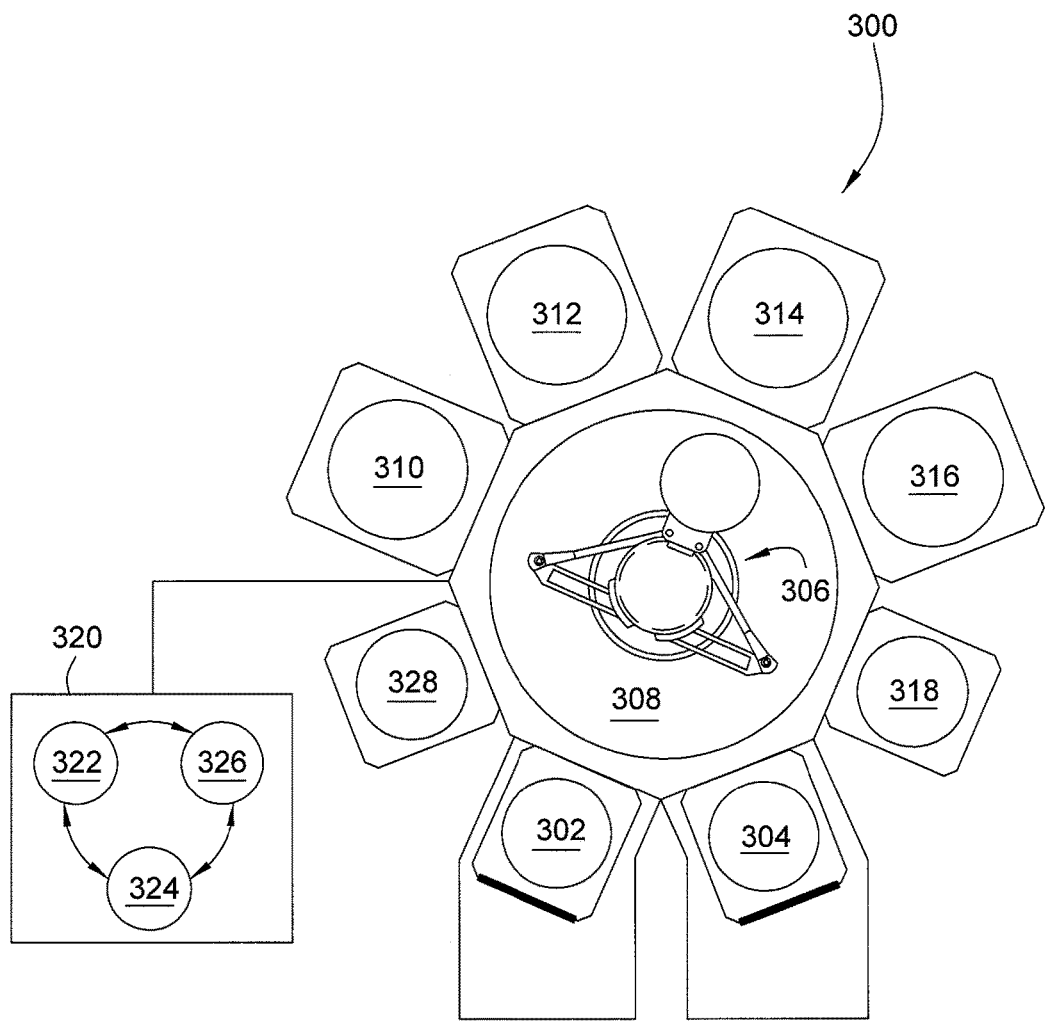
FIG. 3 illustrates a multi-chamber processing system on which the method of FIG. 1 can be practiced, according to one embodiment.

FIG. 3 illustrates a multi-chamber processing system 300. The processing system 300 may include load lock chambers 302, 304, a robot 306, a transfer chamber 308, processing chambers 310, 312, 314, 316, 318, 328, and a controller 320. The load lock chambers 302, 304 allow for the transfer of substrates (not shown) into and out of the processing system 300. Load lock chambers 302, 304 may pump down the substrates introduced into the processing system 300 to maintain a vacuum seal. The robot 306 may transfer the substrates between load lock chambers 302, 304 and the processing chambers 310, 312, 314, 316, 318, and 328. The robot 306 may also transfer the substrates between the load lock chambers 302, 304 and the transfer chamber 308.

Each processing chamber 310, 312, 314, 316, 318, and 328 may be outfitted to perform a number of substrate operations such as atomic layer deposition (ALD), chemical vapor deposition (CVD), PVD, etch, pre-clean, de-gas, heat, orientation, or other substrate processes. Additionally, each processing chamber 310, 312, 314, 316, 318, and 328 may be outfitted to deposit a dielectric barrier layer, deposit a dielectric layer, form one or more vias and trenches in the stack, perform one or more pre-clean processes, deposit the first metal material layer, and deposit the second metal material layer.

The controller 320 may be configured to operate all aspects of the processing system 300, such as the method disclosed in FIG. 1. For example, the controller 320 may be configured to control the method of forming an interconnect on a substrate. The controller 320 includes a programmable central processing unit (CPU) 322 that is operable with a memory 324 and a mass storage device, an input control unit, and a display unit (not shown), such as power supplies, clocks, cache, input/output (I/O) circuits, and the liner, coupled to the various components of the processing system to facilitate control of the substrate processing. The controller 320 also includes hardware for monitoring substrate processing through sensors in the processing system 300, including sensors monitoring the precursor, process gas, and purge gas flow. Other sensors that measure system parameters, such as substrate temperature, chamber atmosphere pressure, and the like, may also provide information to the controller 320.

To facilitate control of the processing system 300 described above, the CPU 322 may be one of any form of general purpose computer processor that can be used in an industrial setting, such as a programmable logic controller (PLC), for controlling various chambers and sub-processors. The memory 324 is coupled to the CPU 322 and the memory 324 is non-transitory and may be one or more of readily available memory such as random access memory (RAM), read only memory (ROM), floppy disk drive, hard disk, or any other form of digital storage, local or remote. Support circuits 326 are coupled to the CPU 322 for supporting the processor in a conventional manner. Charged species generation, heating, and other processes are generally stored in the memory 324, typically as software routine. The software routine may also be stored and/or executed by a second CPU (not shown) that is remotely located from the hardware being controlled by the CPU 322.

The memory 324 is in the form of computer-readable storage media that contains instructions, that when executed by the CPU 322, facilitates the operation of the processing system 300. The instructions in the memory 324 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

The method discussed above may not be tied solely to the processing system 300. For example, one or more blocks, such as block 120 or sub-block 114, may be performed in a processing chamber exterior to the processing system 300.

While the foregoing is directed to embodiments of the present invention, other and further embodiments of the invention may be devised without departing from the basic scope thereof, and the scope thereof is determined by the claims that follow.

What is claimed is:

1. A method of forming an interconnect, comprising:
   forming a via and a trench in a film stack formed on a substrate;
   pre-treating a bottom of the via;
   pre-treating a sidewall of the via;
   depositing a first metal layer formed from a first material of a first type in the via;
   treating a top surface of the first metal layer; then
   depositing a second metal layer formed from a second material of a second type in the trench.

2. The method of claim 1, wherein pre-treating the bottom of the via, comprises:
   transferring the substrate to a first pre-treatment chamber; and
   applying a remote plasma clean process to the film stack, such that an exposed portion of a conductive layer is treated.

3. The method of claim 1, wherein pre-treating the sidewall of the via, comprises:
   transferring the substrate to a first pre-treatment chamber; and
   applying a thermal precursor soak to the film stack.

4. The method of claim 3, further comprising applying ultra-violet energy to the film stack.

5. The method of claim 1, further comprising depositing a barrier seed layer on a top surface of the first metal layer, prior to depositing the second metal layer.

6. The method of claim 1, wherein the first material of the first type is the same as the second material of the second type.

7. The method of claim 1, wherein the first material of the first type is different from the second material of the second type.

8. The method of claim 1, wherein depositing a first metal layer formed from a first material of a first type in the via, comprises depositing the first metal layer using a bottom-up chemical vapor deposition {-CVD-} process.

9. A method of forming an interconnect, comprising:
   depositing a dielectric barrier layer over a first dielectric layer and a conductive layer;
   depositing a second dielectric layer over the dielectric barrier layer;
   forming a via through the second dielectric layer and the dielectric barrier layer;
   forming a trench in the second dielectric layer;
   pre-treating a bottom of the via;
   pre-treating a sidewall of the via;
   depositing a first metal layer formed from a first material of a first type in the via; and
   depositing a second metal layer formed from a second material of a second type in the trench.

10. The method of claim 9, wherein pre-treating the bottom of the via, comprises:
    transferring the substrate to a first pre-treatment chamber; and
    applying a remote plasma clean process to the film stack, such that an exposed portion of a conductive layer is treated.

11. The method of claim 9, wherein pre-treating the sidewall of the via, comprises:
    transferring the substrate to a first pre-treatment chamber; and
    applying a thermal precursor soak to the film stack.

12. The method of claim 11, further comprising applying ultra-violet energy to the film stack.

13. The method of claim 9, further comprising treating a top surface of the first metal layer prior to deposition of the second metal layer.

14. The method of claim 9, further comprising depositing a barrier seed layer on a top surface of the first metal layer, prior to depositing the second metal layer.

15. The method of claim 9, wherein the first material of the first type is the same as the second material of the second type.

16. The method of claim 9, wherein the first material of the first type is different from the second material of the second type.

17. The method of claim 9, wherein depositing a first metal layer formed from a first material of a first type in the via, comprises depositing the first metal layer using a bottom-up chemical vapor deposition {-CVD-} process.

18. A method of forming an interconnect, comprising:
    forming a via and a trench in a film stack formed on a substrate;
    pre-treating a bottom of the via, comprising:
        transferring the substrate to a first pre-treatment chamber,
        applying a remote plasma clean process to the film stack, and
        treating an exposed portion of a conductive layer at the bottom of the via;
    pre-treating a sidewall of the via;
    depositing a first metal layer formed from a first material of a first type in the via; and
    depositing a second metal layer formed from a second material of a second type in the trench.

19. The method of claim 18, wherein pre-treating the sidewall of the via, comprises:
    transferring the substrate to a first pre-treatment chamber; and
    applying a thermal precursor soak to the film stack.

20. The method of claim 19, further comprising applying ultra-violet energy to the film stack.

* * * * *

UNITED STATES PATENT AND TRADEMARK OFFICE
CERTIFICATE OF CORRECTION

PATENT NO. : 10,256,144 B2
APPLICATION NO. : 15/498024
DATED : April 9, 2019
INVENTOR(S) : He Ren et al.

Page 1 of 1

It is certified that error appears in the above-identified patent and that said Letters Patent is hereby corrected as shown below:

In the Claims

In Column 7, Line 58, in Claim 8, after "deposition" delete "{-CVD-}".

In Column 8, Line 40, in Claim 17, after "deposition" delete "{-CVD-}".

Signed and Sealed this
Twenty-fifth Day of June, 2019

Andrei Iancu
*Director of the United States Patent and Trademark Office*